(12) United States Patent
Joshi

(10) Patent No.: US 7,898,843 B2
(45) Date of Patent: Mar. 1, 2011

(54) METHODS AND APPARATUS FOR READ/WRITE CONTROL AND BIT SELECTION WITH FALSE READ SUPPRESSION IN AN SRAM

(75) Inventor: Rajiv V. Joshi, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 437 days.

(21) Appl. No.: 12/140,561

(22) Filed: Jun. 17, 2008

(65) Prior Publication Data

US 2008/0247246 A1    Oct. 9, 2008

Related U.S. Application Data

(62) Division of application No. 11/356,627, filed on Feb. 17, 2006, now Pat. No. 7,420,858.

(51) Int. Cl.
*G11C 11/00* (2006.01)
(52) U.S. Cl. .................. 365/154; 365/191; 365/195
(58) Field of Classification Search .............. 365/154, 365/191, 195
See application file for complete search history.

(56) References Cited

U.S. PATENT DOCUMENTS

| | | | |
|---|---|---|---|
| 5,629,900 A * | 5/1997 | Hirose et al. | 365/189.16 |
| 5,703,831 A | 12/1997 | Sawada | |
| 6,014,340 A | 1/2000 | Sawada | |
| 6,917,536 B1 * | 7/2005 | McLaury et al. | 365/154 |
| 6,940,767 B2 * | 9/2005 | Ooishi et al. | 365/201 |
| 7,085,173 B1 | 8/2006 | Bunce et al. | |
| 7,817,492 B2 * | 10/2010 | Kanari | 365/230.05 |
| 2005/0002257 A1 * | 1/2005 | Mizugaki et al. | 365/222 |
| 2006/0268626 A1 | 11/2006 | Hamzaoglu et al. | |
| 2008/0266936 A1 * | 10/2008 | Kanari | 365/154 |

* cited by examiner

*Primary Examiner*—Tuan T. Nguyen
(74) *Attorney, Agent, or Firm*—Ryan, Mason & Lewis, LLP

(57) ABSTRACT

Methods and apparatus are provided for read/write control and bit selection with false read suppression in an SRAM. According to one aspect of the invention, a bit select circuit is provided for an SRAM. The disclosed bit select circuit comprises one or more transistors controlled by a write control gate signal to prevent data from being read from one or more data cells during a write operation. The transistors can comprise, for example, a pair of gated transistors controlled by the write control gate signal. The write control gate signal prevents data from being read from one or more data cells while the write control gate signal is in a predefined state.

17 Claims, 6 Drawing Sheets

METHODS AND APPARATUS FOR READ/WRITE CONTROL AND BIT SELECTION WITH FALSE READ SUPPRESSION IN AN SRAM

CROSS REFERENCE TO RELATED APPLICATIONS

This application is a divisional of U.S. patent application Ser. No. 11/356,627, filed Feb. 17, 2006 now U.S. Pat. No. 7,420,858, incorporated by reference herein. The present invention is related to U.S. patent application Ser. No. 11/055, 416, entitled "SRAM and Dual Single Ended Bit Sense for an SRAM," filed Feb. 10, 2005, assigned to the assignee of the present invention and incorporated by reference herein.

FIELD OF THE INVENTION

The present invention is related to integrated circuit (IC) memory and, more particularly to circuits for accessing data stored in static random access memory (SRAM) arrays.

BACKGROUND OF THE INVENTION

Integrated circuits (ICs) are commonly made in the well-known complementary insulated gate field effect transistor (FET) technology known as CMOS CMOS technology and chip manufacturing advances have resulted in a steady decrease of chip feature size to increase on-chip circuit switching frequency (circuit performance) and the number of transistors (circuit density). In what is typically referred to as scaling, device or FET features are reduced to reduce corresponding device minimum dimensions including both horizontal dimensions (e.g., minimum channel length) and vertical dimensions (e.g., channel layer depth), gate dielectric thickness and junction depths. Reducing the device size increases the device density and performance, and reduces device-operating conditions, i.e., chip (and thus device) supply voltages and voltage swings. Consequently, as a result of scaling, otherwise seemingly negligible device-to-device variations (e.g., length, width and threshold) have caused serious design problems, especially in signal critical circuits such as memory sense amplifiers.

A typical CMOS circuit includes paired complementary devices, i.e., an N-type FET (NFET) paired with a corresponding P-type FET (PFET), usually gated by the same signal. Since the pair of devices have operating characteristics that are, essentially, opposite one another, when one device (e.g., the NFET) is on and conducting (ideally modeled as a closed switch), the other device (the PFET in this example) is off, and not conducting (ideally modeled as an open switch) and, vice versa. So, for example, a CMOS inverter is a series connected PFET and NFET pair that are connected between a power supply voltage (often referred to as Vdd) and ground (GND).

An ideal static random access memory (SRAM) cell includes a balanced pair of cross-coupled inverters storing a single data bit with a high at the output of one inverter and a low at the output of the other inverter. A pair of pass gates (also ideally, a balanced pair of FETs) selectively connects the complementary outputs of the cross-coupled inverter to a corresponding complementary pair of bit lines. A word line connected to the gates of the pass gate FETs selects the cell, connecting the cell contents to the corresponding complementary pair of bit lines. An N-by-M SRAM array is organized as N rows of word lines by M columns of line pairs. Accessing a K bit single word (for a read or a write) from the array entails driving one of the N word lines. During a read operation, each cell on the selected word line couples its contents to its corresponding bit line pair through NFET pass gates. Each cell on a selected column line may be coupled to a simple sense amplifier (often referred to as a sense amp and ideally embodied as a matched pair of cross-coupled common-source devices connected between a bit line pair and an enable source line). Since the bit line pair is typically precharged to some common voltage, initially, the internal (to the cell) low voltage rises until one of the bit line pairs drops sufficiently to develop a small difference signal (e.g., 30 mV) on the bit line pair.

Since a design shape printed and formed at different locations always has some variation in the way it prints, imbalances in a matched cell device pair or a matched sense amp pair is inevitable. These imbalances unbalance the pair and may seriously erode the sense signal margin and even cause data sense errors. This erosion may be even worse in partially depleted (PD) silicon on insulator (SOI) CMOS SRAM cells and circuits, because PD SOI devices are subject to floating body effects. Floating body effects, also referred to as body effects or history effects, occur in completely or partially isolated (e.g., where body resistance may have rendered body contacts ineffective) devices, where the device substrate or body is floating or essentially floating. As a floating body device switches off, charge (i.e., from majority carriers) remains in the device body beneath the channel. Device leakage and parasitic bipolar effects may add to the charge. Charge builds at isolated devices as the chip operates because the charge from fast switching devices is injected into locally isolated body pockets faster than it dissipates. Eventually, the injected charge reaches some steady state value that acts as a substrate bias, e.g., shifting the threshold voltage ($V_T$) for the device. This steady state change depends upon the switching history of each particular device and is thus also referred to as the history effects for the particular device.

The result of the body effects may be that two identical-by-design adjacent devices exhibit some difference that may be time varying, e.g., from changing circuit conditions during read and write operations. Body effects can unbalance a matched pair of devices in a sense amp, for example. Sense amp mismatches can thus cause the data to be read erroneously. U.S. patent application Ser. No. 11/055,416, entitled "SRAM and Dual Single Ended Bit Sense for an SRAM," discloses a domino sensing technique for this problem by replacing the sense amps with domino sensing. Generally, data from a given cell is amplified through an inverter and gated with a read signal. While this technique may reduce erroneous read operations, it may pose a problem during a write operation. If the write signal arrives later than the word signal, then the cell can erroneously start reading the data (referred to as a "false read"), causing a glitch at the output and corrupting the output boundary latches.

A need therefore exists for improved methods and apparatus for SRAM data sense reliability with suppression of such false reads.

SUMMARY OF THE INVENTION

Generally, methods and apparatus are provided for read/write control and bit selection with false read suppression in an SRAM. According to one aspect of the invention, a bit select circuit is provided for an SRAM. The disclosed bit select circuit comprises one or more transistors controlled by a write control gate signal to prevent data from being read from one or more data cells during a write operation. The transistors can comprise, for example, a pair of gated transistors controlled by the write control gate signal. The write control gate signal prevents data from being read from one or more data cells while the write control gate signal is in a predefined state.

According to another aspect of the invention, a write operation can occur when the write control gate signal and a write control signal each have predefined values. A second value of the write control gate signal prevents a read operation during a write operation. For example, a write operation can occur when the write control gate signal and the write control signal are both activated for at least a minimum time duration and then the write control gate signal is de-activated for at least a minimum time duration to permit the write operation. Data is prevented from being read from one or more data cells during the write operation by activating the write control gate signal before activating a corresponding word signal during the write operation. In this manner, the data is prevented from being transferred when the write control gate signal is in a predefined state.

A more complete understanding of the present invention, as well as further features and advantages of the present invention, will be obtained by reference to the following detailed description and drawings.

DETAILED DESCRIPTION

The present invention provides methods and apparatus for read/write control and bit selection with false read suppression in an SRAM. As previously indicated, and discussed further below in conjunction with FIG. 4, if a write signal arrives later than the word signal, then the cell can erroneously start reading the data (referred to as a "false read"), causing a glitch at the output and corrupting the output boundary latches.

Figure 1:
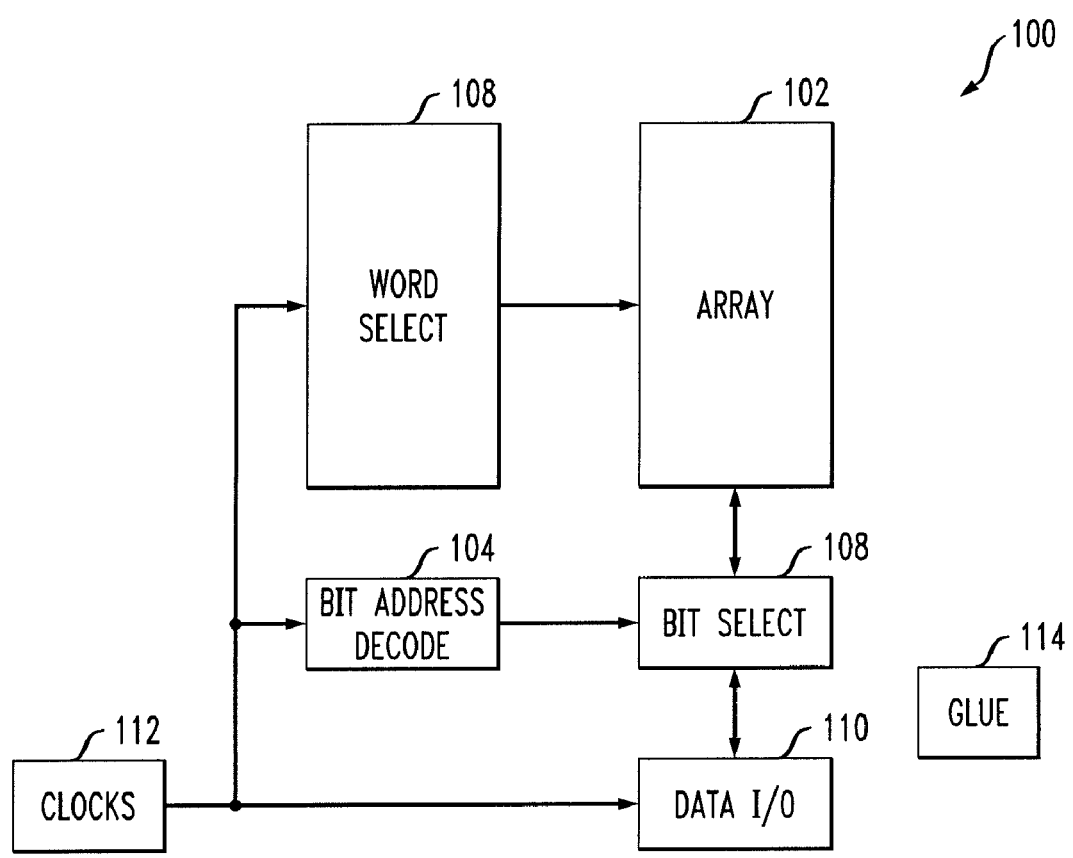
FIG. 1 illustrates a block diagram of an exemplary memory, macro or chip data path.

FIG. 1 illustrates a block diagram of an exemplary memory, e.g., a static random access memory (SRAM) macro or chip 100. Bit address decode 104 to the bit select circuit 106 selects a pair of bit lines (an array column) and, during a read, both of the selected bit lines are sensed completely independently of the other, i.e., single ended as opposed to differentially. The SRAM is in a standard insulated gate field effect transistor (FET) technology. More particularly, the SRAM is in the complementary FET technology that is commonly referred to as CMOS or in multi-threshold CMOS (MTCMOS). In this example, cells (not shown) of an array 102 are selected by coincidence of a column (selected by the bit select circuit 106) with a row (i.e., a word line) selected by word decoder 108. Data input/output (I/O) drivers 110 pass data to and from the select circuit 106. Thus, during a lead, I/O drivers 110 re-drive both single ended results from the select circuit 106; and during a write, I/O drivers 110 provide data to the select circuit 106. Clock logic 112 provides local timing (e.g., to synchronize the SRAM 100 to other chip circuits) and glue logic 114 provides local control logic.

Figure 2:
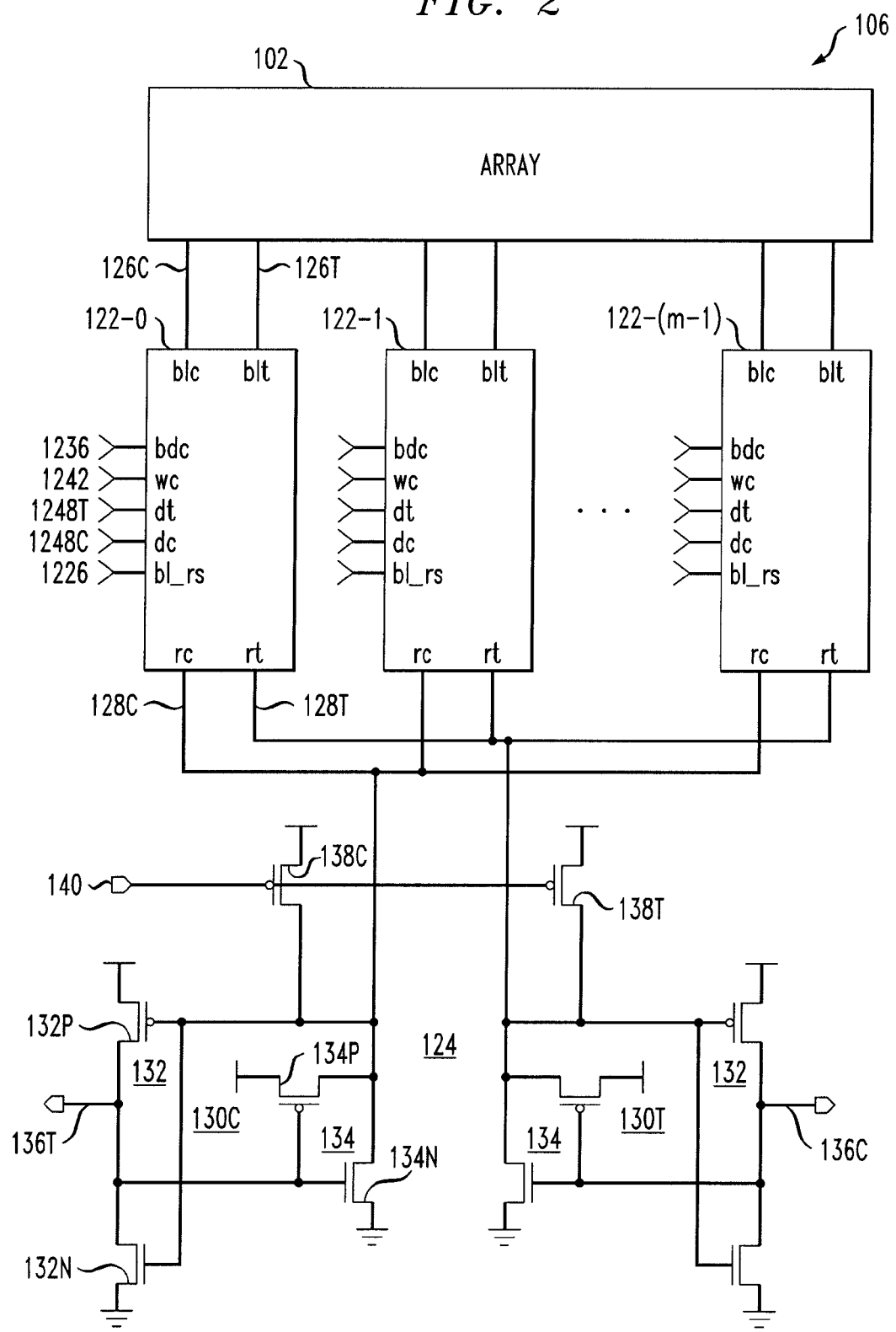
FIG. 2 illustrates an example of a data path cross section from the SRAM array through a column selected by a bit select circuit and through a data output driver.

FIG. 2 illustrates an example of a data path cross section 120 from an array 102 through a column selected by a corresponding bit select circuit 122-0 through 122-($m-1$) in the bit select circuit (e.g., 106 of SRAM 100 of FIG. 1) and a data output driver 124, e.g., in data I/O drivers 110. A pair of bit lines 126T, 126C from array 102 connects a column of cells to each bit select circuit 122-0 through 122-($m-1$). Each bit select circuit 122-0 through 122-($m-1$) selectively drives data contents from the array 102 on one of output pair 128T, 128C to the data output driver 124. The output data driver 124 includes a pair of latches 130T, 130C connected to a corresponding one of the selected output pair 128T, 128C. Each of the pair of latches 130T, 130C includes a pair of cross coupled inverters (e.g., 132, 134), driving select outputs 136T, 136C selectively-complementary. One or both of the cross coupled inverters 132, 134 (e.g., 132) are skewed inverters with a high threshold ($V_{T+}$) N-type FET (NFET) 132N, 134N (e.g., 0.2V higher than design nominal or normal) paired with a corresponding normal $V_T$ P-type FET (PFET), 132P, 134P. Read enable/reset devices 138C, 138I are PFETs in this example, gated by a read select signal 140.

The increased threshold weakens the NFET drive current (i.e., $V_{GS}-V_T$ is reduced) such that PFETs 138C and 138T need not be inordinately large to match the NFET 134N current and so, shifts the latch 130C, 130T switching point to facilitate setting each of the latches 130C, 130T independent of the state of the other. For examples of selectively forming high threshold devices, see, e.g., U.S. patent application Ser. No. 10/644,211, entitled "Method Of Reducing Leakage Current In Sub One Volt SOI Circuits" to Richard B. Brown et al., filed Aug. 22, 2003; or U.S. patent application Ser. No. 10/950,940, entitled "Integrated Circuit Chip With Improved Array Stability" to Yuen H. Chan et al., filed Sep. 27, 2004, both assigned to the assignee of the present invention and incorporated herein by reference.

In a typical SRAM array organized as N words by M columns by K data bits, the array may be further organized with a single data output driver 124 for each data bit and M bit select circuits 122-0, 122-1, . . . , 122-($m-1$) connected together at the select output pair 128T, 128C. Normally, both of the select output pair 128T, 128C are in high impedance (Hi-Z) states and, except during a read, reset select signal 140 is low to turn on both reset PFETs 138C, 138T, clamping both select outputs 128T, 128C high. With both select outputs 128T, 128C clamped high, both selectively-complementary data outputs 136T, 136C are low. A read begins with reset select 140 going high to float select outputs 128T, 128C. As noted hereinabove, one bit pair of bit lines 126T, 126C is selected from array 102 by selecting of one of the bit select circuits 122-0 through 122-($m-1$). One of the select outputs 128T, 128C is driven low to set the corresponding latch 130T, 130C and, thereby drive a corresponding one of selectively-complementary data outputs 136T, 136C high. Thereafter, the select outputs 128T, 128C may return to Hi-Z, while the latches 130T, 130C hold the data value until the reset select 140 is driven low to reset the latches 130T, 130C.

Figure 3:
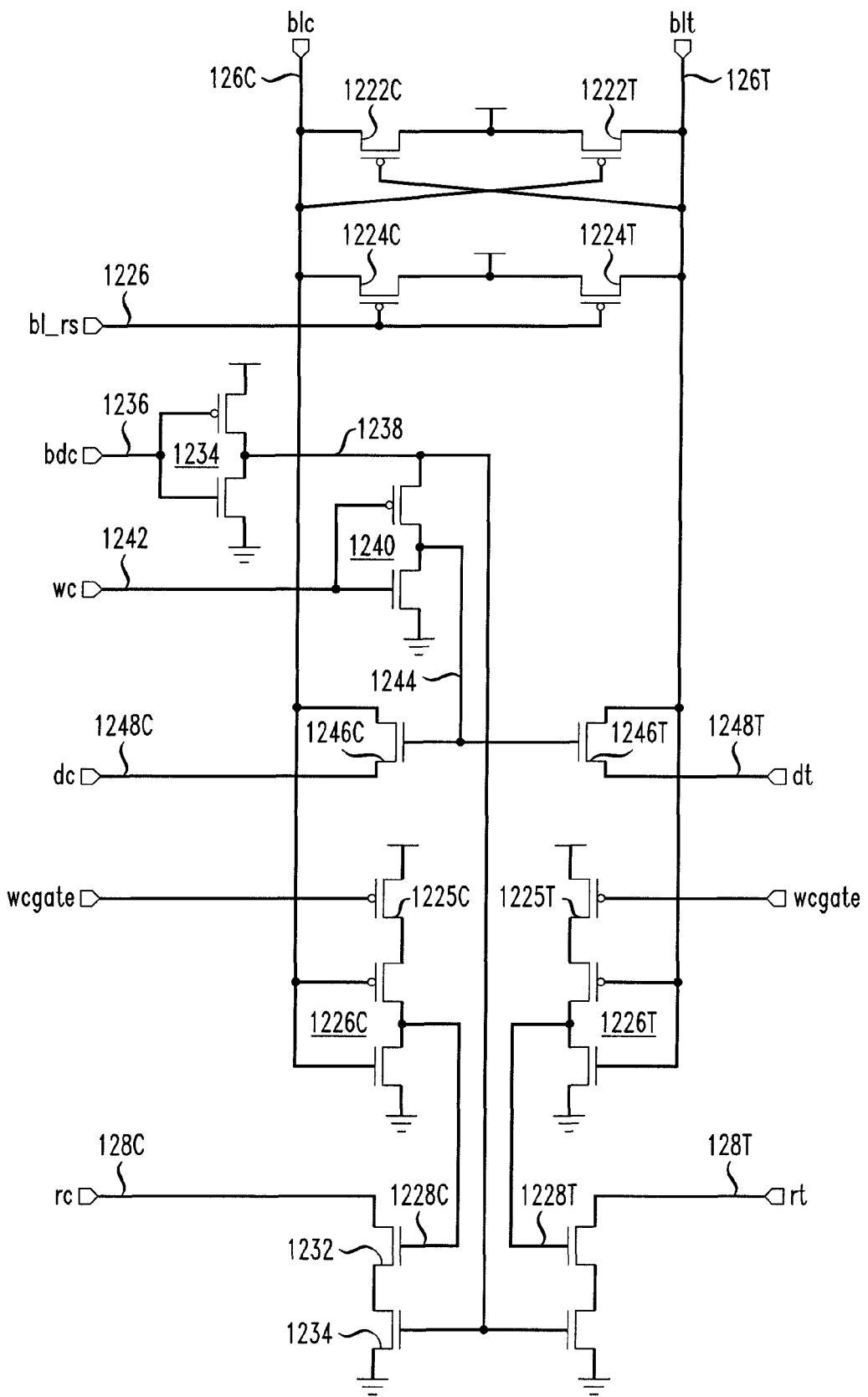
FIG. 3 illustrates an exemplary single bit select circuit according to a first embodiment of the invention.

FIG. 3 illustrates an exemplary single bit select circuit 122 according to a first embodiment of the invention. A single bit select circuit 122 selectively senses a signal developing on either of the bit line pair 126C, 126T, independently of a signal or lack thereof developing and being sensed on the other of the pair. Bit lines 126C, 126I from the array (e.g., 102 in FIGS. 1 and 2) connect to a pair of cross-coupled PFETs 1222C, 1222T and restore PFETs 1224C, 1224T, which are gated by bit line restore signal 126. Each PFET 1222C, 1222T and 1224C, 1224T is connected drain to source between a respective one of the bit lines 126C, 126I and a supply, e.g., $V_{DD}$.

Figure 4:
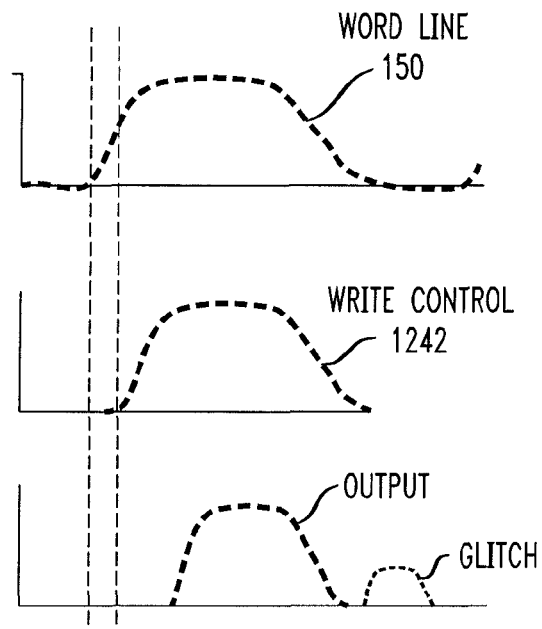
FIG. 4 illustrates an example of a timing diagram that exhibits a false lead through the data path for accessing cells on a single word line in the array of FIG. 1.

Each of the bit lines 126C, 126T drive a skewed inverter 1226C, 1226T, discussed further below. The outputs of each of skewed inverters 1226C, 1226T are an input to a two input (2-way) NAND gates 1228C, 1228T, which are floating open drain gates and connected to select outputs 128C, 128T, respectively. Each of the open drain NAND gates 1228C, 1228T includes a pair of series connected NFETs (e.g., 1230, 1232), connected between a respective one of floating select outputs 128C, 128T and ground. An inverter 1234 receives a bit decode signal 1236 (e.g., from bit address decode 104) The bit select output 1238 of inverter 1234 is the other input to each of the open drain NAND gates 1228C, 1228T. The bit select output 1238 also acts as a switched supply voltage for an inverter 1240 that is driven by a write select signal 1242 and provides a write enable output 1244. Effectively, the write enable output 1244 is the NOR of the bit decode signal 1236 and the write select signal 1242. The write enable 1244 gates a pair of NFET pass gates 1246C, 1246T that are each connected between one of the complementary bit lines 126C, 126T and a corresponding complementary pair of data inputs 1248C, 1248T According to one aspect of the invention, the bit select circuit 122 of FIG. 3 incorporates circuitry to reduce the likelihood of a false read. FIG. 4 illustrates an example of a timing diagram that exhibits a false read through the data path for accessing cells on a single word line 150 in array 102. As indicated above, if a write select signal 1242 arrives later than the word signal 150, then the cell can erroneously start reading the data (referred to as a "false read"), causing a glitch at the output and corrupting the output boundary latches.

Returning to FIG. 3, a bit select circuit 122 according to first embodiment of the invention includes skewed inverters 1226C, 1226T each having an additional gated transistor 1225C, 1225T controlled by a write control gate signal, wcgate, to suppress the data path and prevent a false read. The generation of the wcgate signal is discussed below in conjunction with FIG. 7.

Generally, when the wcgate signal is low, the gated transistors 1225C, 1225T are activated and a normal write operation can continue. Likewise, when the wcgate signal is high, the gated transistors 1225C, 1225T are not activated and a read operation is suppressed. A write operation thus occurs when the wcgate signal is low and the write control signal 1242 is high. The present invention blocks a false read operation by activating the wcgate signal before activating the word signal 150 during a write operation. In other words, the gated transistor, under control of the gate signal, wcgate, prevents the data from transferring from the cell when the gate signal, wcgate, is high.

Figure 5:
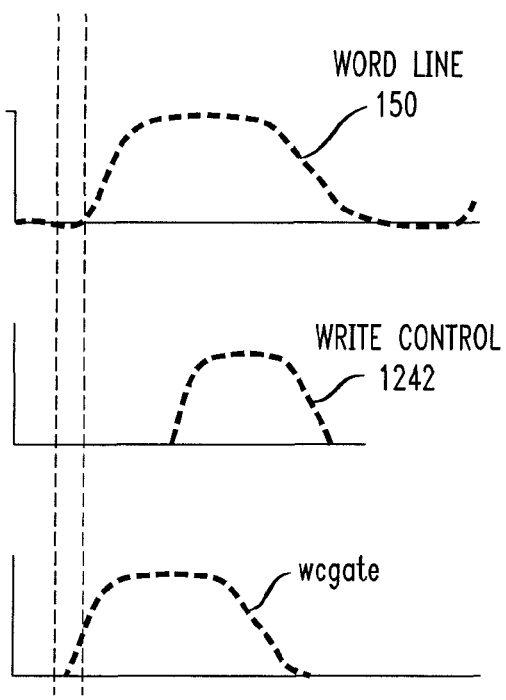
FIG. 5 illustrates an example of a timing diagram that demonstrates false read suppression in accordance with the present invention.

Thus, FIG. 5 illustrates an example of a timing diagram through the data path for accessing cells on a single word line 150 in array 102. The gate signal, wcgate, is activated before activating the word signal 150 during a write operation. Thus, if a write select signal 1242 arrives later than the word signal 150, then a false read operation is suppressed. In addition, the gate signal, wcgate, should remain activated (high) for some overlap with the write control signal 1242 and then turn off to provide sufficient time for the write operation.

Figure 6:
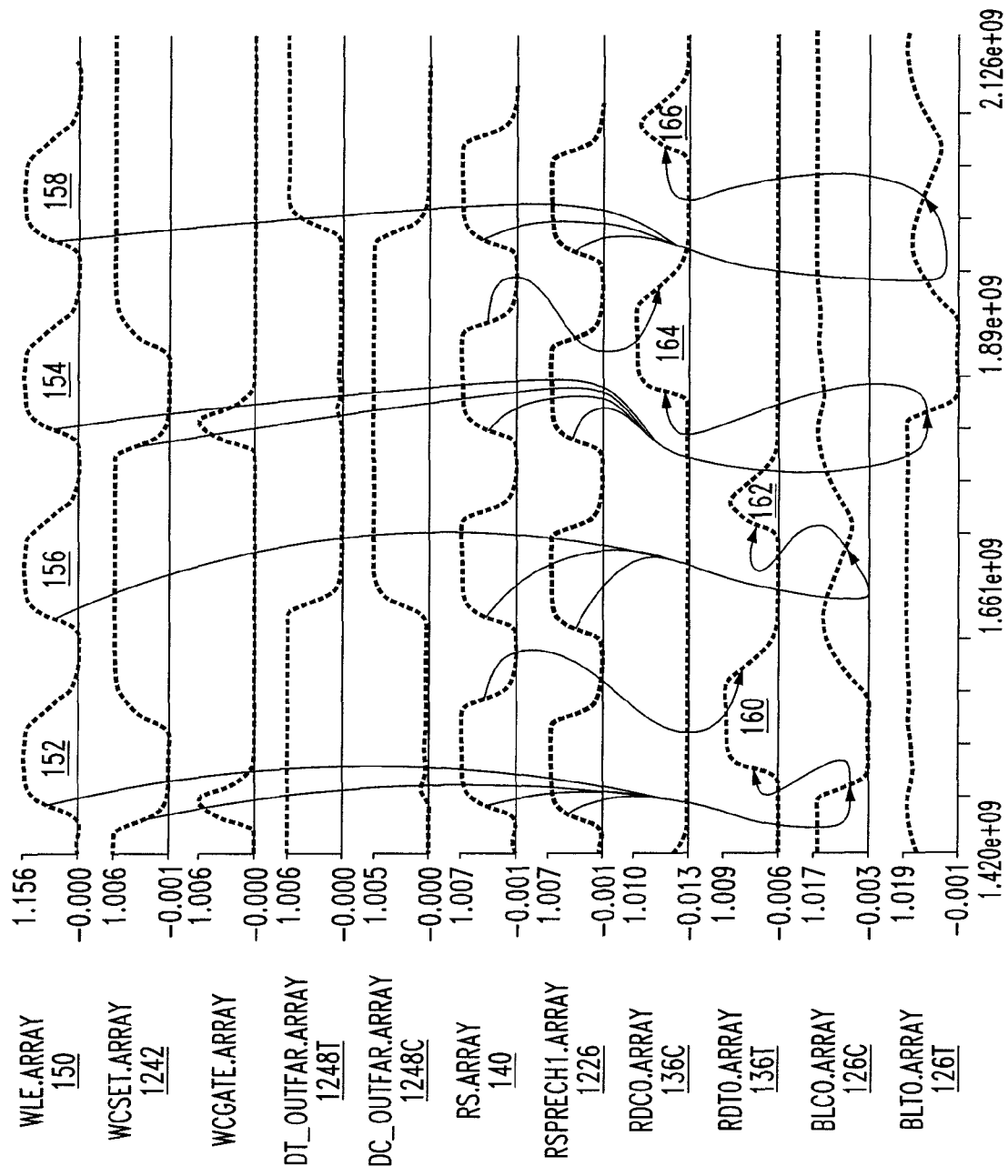
FIG. 6 illustrates an example of a timing diagram through the data path for accessing cells on a single word line in the array of FIG. 1.

FIG. 6 illustrates an example of a timing diagram through the data path for accessing cells on a single word line 150 in array 102 with reference to the cross sections of FIGS. 2 and 3. The timing diagram in FIG. 6 also illustrates the gate signal, wcgate, in accordance with the present invention. It is noted that the pulse width of the gate signal, wcgate, can be varied, provided that it is activated before the word signal 150 during a write operation, and remains activated (high) for some overlap with the write control signal 1242 and then turns off to provide sufficient time for the write operation.

In this example, two write accesses 152, 154, are each followed by a read access, 156, 158, of the same location. When the word line 150 goes high during each access 152, 154, 156, 158, reset signals 140, 1226, are also driven high, turning off PFETs 138C, 138T and 1224C, 1224T, respectively. With PFETs 138C, 138T, 1224C and 1224T off, both the bit lines 126C, 126T and the select outputs 128C, 128T are floating, pre-charged high. Thus, when the write select signal 1242 falls during the write accesses, 152, 154, inverter 1240 drives the write enable output 1244 high to turn on NFET pass gates 1246C, 1246T, which couples the contents of the complementary pair of data inputs 1248C, 1248T to the bit lines 126C, 126T. During each write, one of the bit lines (e.g., 126C in 152) is pulled low and the other (126T) remains high. Cross-coupled PFETs 1222C, 1222T prevent early reads, e.g., from the word line 150 selecting a connected cell prior to asserting the write signal 1242. So, as the complementary bit line 126C falls, only the output of the corresponding inverter 1226T rises and is combined (NANDed) in NAND gate 1228C with bit select output 1238 to pull select output 128C low. As noted above with respect to data output driver 124, when select output 128C falls, it sets latch 130C, which drives output 136T high in pulse 160 with output 136C, 136T providing complementary signals until the word line 150 falls and the data path is reset.

During the reset, both bit lines 126C, 126T are pulled high, which assures that the output is low for both inverters 1246C, 1246T. So, regardless of the bit select signal, NAND gates 1228C, 1228T are off. Similarly, with reset 140 low, PFETs 138C, 138T are on, resetting the latches 130C, 130T with latch outputs 136T, 136C both low.

In the subsequent read 156 of the same cell, the word line 150 and reset signals 140, 1226 are driven high, and write signal 1242 remains high. Once sufficient signal develops on the respective bit line 126C, skewed inverter 1226C drives high so that NAND gate 1228C sets latch 130C driving complementary output 136T high in pulse 162, independent of the difference on the bit line pair 126C, 126T. The cell contents are switched in the next write 154 as reflected by the high 164 on the complementary output 136C and confirmed in the following read 158 by the low going signal developing on the bit line 126C and confirmed by the high 166 on the complementary output.

Figure 7:
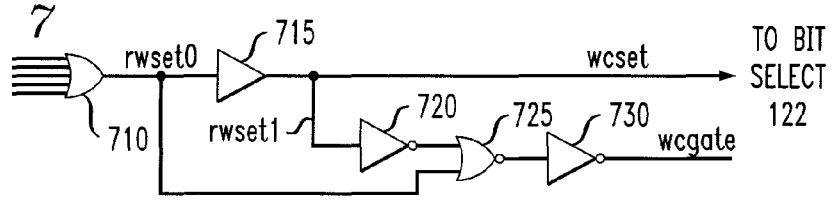
FIG. 7 illustrates exemplary read/write control circuitry for generation of the gate signal, wcgate.

FIG. 7 illustrates exemplary read/write control circuitry for generation of the gate signal, wcgate. As shown in FIG. 7, a read/write decoder 710 decodes the read/write control signal to generate the decoded signal, rwset0. The decoded signal, rwset0, and an opposite polarity delayed signal, rwset1, are applied to a nand gate 725. The signal, rwset1, is generated by delaying 715 and inverting 720 the decoded signal, rwset0. The output of the nand gate 725 is inverted by inverter 730 to generate the gate signal, wcgate, having the same polarity as rwset0. The pulsewidth of the signal, rwset0, is then chopped. The polarity of the signal, rwset0, (and thus the gate signal, wcgate) is opposite to the polarity of the read/write control signal "wcset" 1242 which is gated with the bit select signal.

When the wcgate signal is high the gated transistors 1225C, 1225T are shut off. The signal wcgate is a leading signal (relative to the word line) with a short pulsewidth, the signal wcgate goes low after the write control signal activates the NFET transistor shown in FIG. 3. If the word line 150 comes early (before the write control 1242) and the cell starts reading during the write operation, then the gate signal, wcgate (with active "high" polarity) prevents the gated transistor 1225C, 1225T from turning on. Thus, a "false read" before "write" is prevented. When the write control signal (wcset) turns on, the wcgate signal (which leads the wcset signal) turns off (i.e., it becomes a "low" signal allowing the write data to pass through). Thus, using the "chopped" read/write leading signal, any false reading can be blocked.

During the read operation, the gate signal, wcgate, is low throughout the operation. Thus, the gate signal, wcgate, serves a dual purpose of preventing a "false read" and improving read performance. For example, by activating the word line 150 30 picoseconds ahead of the read/write control signal 1242, the read performance can be improved by 30 picoseconds which is approximately a 16-20% improvement as the read is gated by the bit decode signal.

Figure 8:
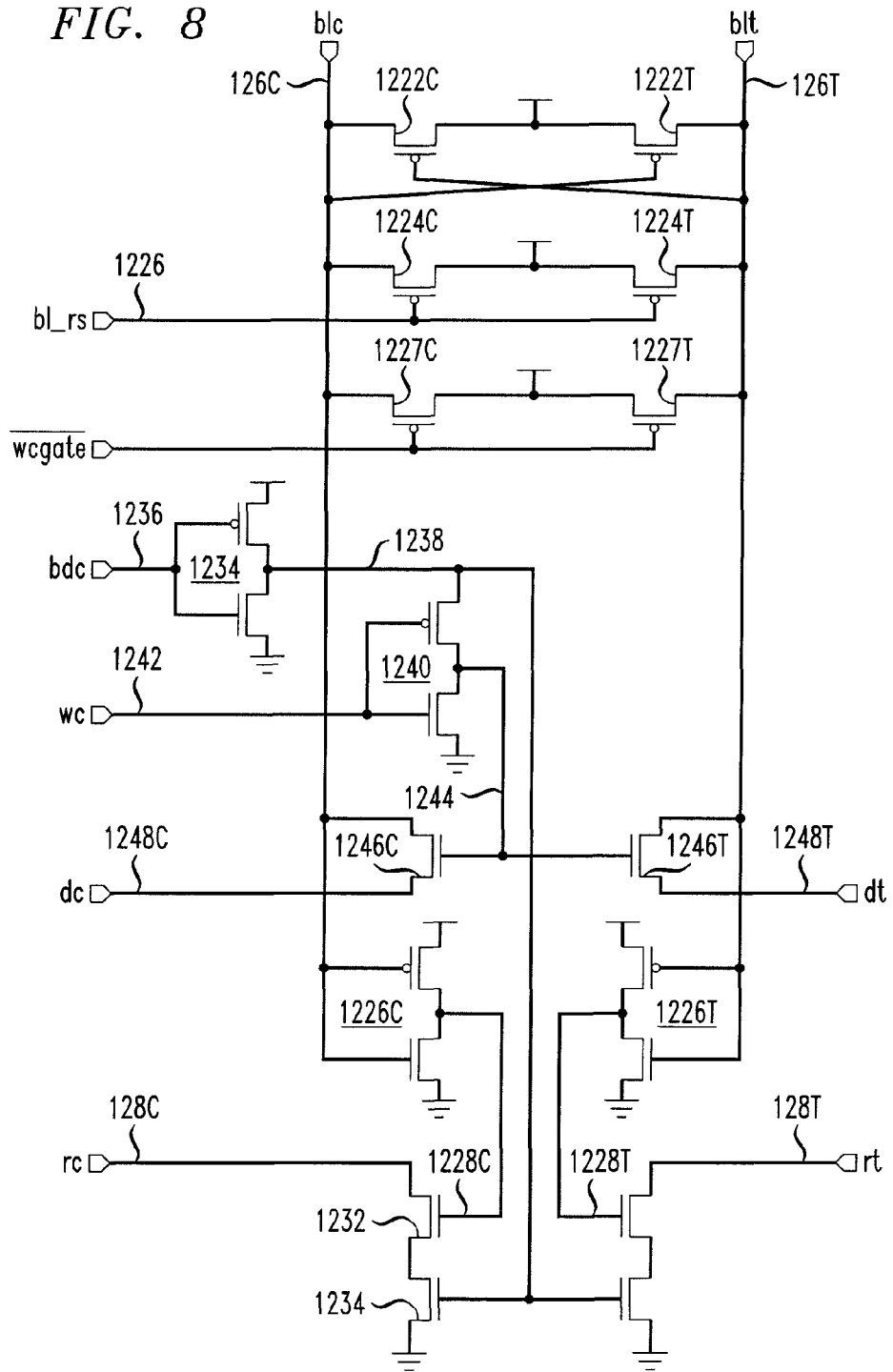
FIG. 8 illustrates an exemplary single bit select circuit according to a second embodiment of the invention.

FIG. 8 illustrates an exemplary single bit select circuit 122 according to a second embodiment of the invention. It is noted that elements in FIG. 8 operate in a similar manner to the like-numbered elements in FIG. 3, discussed above. As shown in FIG. 8, a bit select circuit 122 according to a second embodiment of the invention includes additional gated transistor 1227C, 1227T controlled by a complement of write control gate signal, $\overline{\text{wcgate}}$, to suppress the data path and prevent a false read. The generation of the $\overline{\text{wcgate}}$ signal can be performed using an inverted version of the wcgate signal generated in FIG. 7. In the embodiment of FIG. 8, the complement of write control gate signal, $\overline{\text{wcgate}}$, prevents the transfer of the data coming from the cell. Thus, the bit line is maintained at a high value, and a false read is prevented.

Advantageously, an exemplary embodiment SRAM bit select includes a dual single-ended sense that senses correct data contents and provides a selectively complementary data output signal. Further, since each of the pair of bit lines is sensed independently of the other, a bit select is relatively insensitive to device mismatches. Since the dual single-ended sense paths are substantially identical, such mismatches normally only result in slight, if perceptible, timing differences between stored data states.

It is to be understood that the embodiments and variations shown and described herein are merely illustrative of the principles of this invention and that various modifications may be implemented by those skilled in the art without departing from the scope and spirit of the invention.

What is claimed is:

1. A bit select circuit for a static random access memory (SRAM), comprising:
    one or more transistors controlled by a write control gate signal to prevent data from being read from one or more data cells during a write operation.

2. The bit select circuit of claim 1, wherein said write control gate signal prevents data from being read from one or more data cells while said write control gate signal is in a predefined state.

3. The bit select circuit of claim 1, wherein said one or more transistors comprises a pair of gated transistors controlled by said write control gate signal.

4. The bit select circuit of claim 1, wherein a first value of said write control gate signal allows a write operation to proceed.

5. The bit select circuit of claim 1, wherein a write operation can occur when said write control gate signal and a write control signal each have predefined values.

6. The bit select circuit of claim 5, wherein said write control gate signal and said write control signal are both activated for at least a minimum time duration and then said write control gate signal is de-activated for at least a minimum time duration to permit said write operation.

7. The bit select circuit of claim 1, wherein a second value of said write control gate signal prevents a read operation during a write operation.

8. The bit select circuit of claim 1, wherein said data is prevented from being read from one or more data cells during said write operation by activating said write control gate signal before activating a corresponding word signal during said write operation.

9. The bit select circuit of claim 1, wherein said data is prevented from being read from one or more data cells during said write operation by preventing said data from being transferred when said write control gate signal is in a predefined state.

10. The bit select circuit of claim 1, wherein said static random access memory is implemented using CMOS technology.

11. A static random access memory (SRAM) including an array of SRAM cells arranged in rows and columns, each of said columns including cells connected to a pair of bit lines and a bit select for said column, said bit select comprising:
    one or more transistors controlled by a write control gate signal to prevent data from being read from one or more data cells during a write operation.

12. The SRAM of claim 11, wherein said write control gate signal prevents data from being read from one or more of said cells while said write control gate signal is in a predefined state.

13. The SRAM of claim 11, wherein said one or more transistors comprises a pair of gated transistors controlled by said write control gate signal.

14. The SRAM of claim 11, wherein a write operation can occur when said write control gate signal and a write control signal each have predefined values.

15. The SRAM of claim 14, wherein said write control gate signal and said write control signal are both activated for at least a minimum time duration and then said write control gate signal is de-activated for at least a minimum time duration to permit said write operation.

16. The SRAM of claim 11, wherein said data is prevented from being read from one or more of said cells during said write operation by activating said write control gate signal before activating a corresponding word signal during said write operation.

17. The SRAM of claim 11, wherein said data is prevented from being read from one or more of said cells during said write operation by preventing said data from being transferred when said write control gate signal is in a predefined state.

* * * * *